(12) United States Patent
Hong et al.

(10) Patent No.: US 7,557,638 B2
(45) Date of Patent: Jul. 7, 2009

(54) CIRCUIT FOR SUPPRESSING VOLTAGE JITTER AND METHOD THEREOF

(75) Inventors: Yun-Jan Hong, Tai-Chung (TW); Ming-Yuh Yeh, Taipei (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/758,679

(22) Filed: Jun. 6, 2007

(65) Prior Publication Data

US 2008/0150627 A1  Jun. 26, 2008

(30) Foreign Application Priority Data

Dec. 22, 2006 (TW) .............................. 95148346 A

(51) Int. Cl.
*H03K 5/00* (2006.01)
*H01J 19/82* (2006.01)

(52) U.S. Cl. ...................................... 327/532; 327/551
(58) Field of Classification Search ......... 327/551–559, 327/530–532; 363/39
See application file for complete search history.

(56) References Cited

U.S. PATENT DOCUMENTS

| | | | |
|---|---|---|---|
| 6,014,037 A * | 1/2000 | Gabara et al. ................. | 326/30 |
| 6,822,345 B2 * | 11/2004 | Gauthier et al. ............... | 307/64 |
| 6,842,351 B2 * | 1/2005 | Gauthier et al. ............... | 363/39 |

* cited by examiner

*Primary Examiner*—Dinh T. Le
(74) *Attorney, Agent, or Firm*—Thomas, Kayden, Horstemeyer & Risley

(57) ABSTRACT

A voltage jitter suppression circuit and a method thereof are disclosed. The circuit is utilized for alleviating the voltage jitter phenomenon of an IC. Regardless of the circuit frequency and voltage, the voltage jitter phenomenon of the circuit can be improved significantly by utilizing the present invention.

20 Claims, 11 Drawing Sheets

CIRCUIT FOR SUPPRESSING VOLTAGE JITTER AND METHOD THEREOF

BACKGROUND OF THE INVENTION

1. Field of the Invention

The present invention relates to an electronic circuit, and more particularly, to an electronic circuit for suppressing a jitter noise in voltage Vdd in an integrated circuit (IC).

2. Description of the Prior Art

Integrated circuit (IC) designers nowadays pay much more attention to high speed and low voltage design issues. The parasitic inductance generated due to the packaging of an IC such as wire bonding has a significant influence on the internal circuitry of the IC. For example, a voltage jitter phenomenon is generated by the power. The voltage jitter phenomenon will reduce the circuit performance significantly, especially in IC designs related to high frequency and low voltage.

The conventional methods for suppressing the voltage jitter phenomenon include utilizing a better packaging scheme and utilizing a multiple bonding wire scheme (such as three-fold, four-fold, or five-fold bonding wire schemes). FIG. 1 shows a simplified block diagram 100 of the five-fold bonding wire scheme according to conventional art. In this conventional art, a chip 102 includes a pin 104, a plurality of power bonding pads 105-109, a plurality of bonding wires 110-114, and an equivalent capacitor 120, wherein the plurality of bonding wires 110-114 have an inductance value, and the plurality of bonding wires 110-114 are coupled to the pin 104 and the power bonding pad 105-109 respectively. The power bonding pads 105-109 are coupled to a power terminal inside the chip 102. Theoretically, the greater the number of bonding wires, the better the suppressing effects. The conventional methods apply the theory of more inductances connected in parallel generating a smaller equivalent inductance value, so as to reduce the effective parasitic inductance value. The purposes of these two conventional arts are both to reduce the parasitic inductance value and to suppress negative performance impacts resulting from voltage jitter.

Conventional methods utilizing a better packaging scheme or more bonding wires require more bonding pads, and thus a larger chip area to accommodate the increased number of bonding pads. Thus, conventional methods suffer from higher packaging and wire bonding costs. The competitiveness of the IC is based on the circuit performance and its manufacturing cost. Thus, improving IC performance while lowering cost is a perpetually important issue for IC design researchers.

SUMMARY OF THE INVENTION

It is therefore one of the objectives of the present invention to provide a circuit for suppressing voltage jitter in order to solve the above-mentioned problems. Such a circuit for suppressing voltage jitter will provide a solution for the current and future trends of low voltage and high frequency circuits. To lower costs, the voltage jitter suppression circuit need not use too many bonding pads or a better packaging scheme.

A voltage jitter suppression circuit of the present invention includes a pin; a first bonding pad; a first bonding wire, coupled between the pin and the first bonding pad, having a first inductance; and a damping impedance coupled between the power line and the first bonding pad.

A method for alleviating a voltage jitter of a power line of an integrated circuit (IC) of the present invention includes providing a pin and a first bonding pad; providing a first bonding wire coupled between the pin and the first bonding pad, wherein the first bonding wire has a first inductance; and providing a damping impedance coupled between the power line of the IC and the first bonding pad.

Next, an impedance value of the damping impedance can be adjusted according to the differences between the values of the elements inside the equivalent circuit composed of the elements mentioned above, in order to attain the requirement of alleviating the voltage jitter between the two terminals of the equivalent circuit as quickly as possible.

The damping impedance value of the equivalent circuit architecture is not only able to restrain the voltage jitter phenomenon efficiently so as to improve the performance of the circuit, but can also indirectly reduce the chip cost since the number of I/O pins outside the chip is substantially decreased.

Regardless of the circuit frequency and voltage, the voltage jitter phenomenon of the circuit can be improved significantly by utilizing the present invention according to the above description. In addition, the chip cost will also be reduced since it is not required to increase the number of the bonding pads.

DETAILED DESCRIPTION

Figure 1:
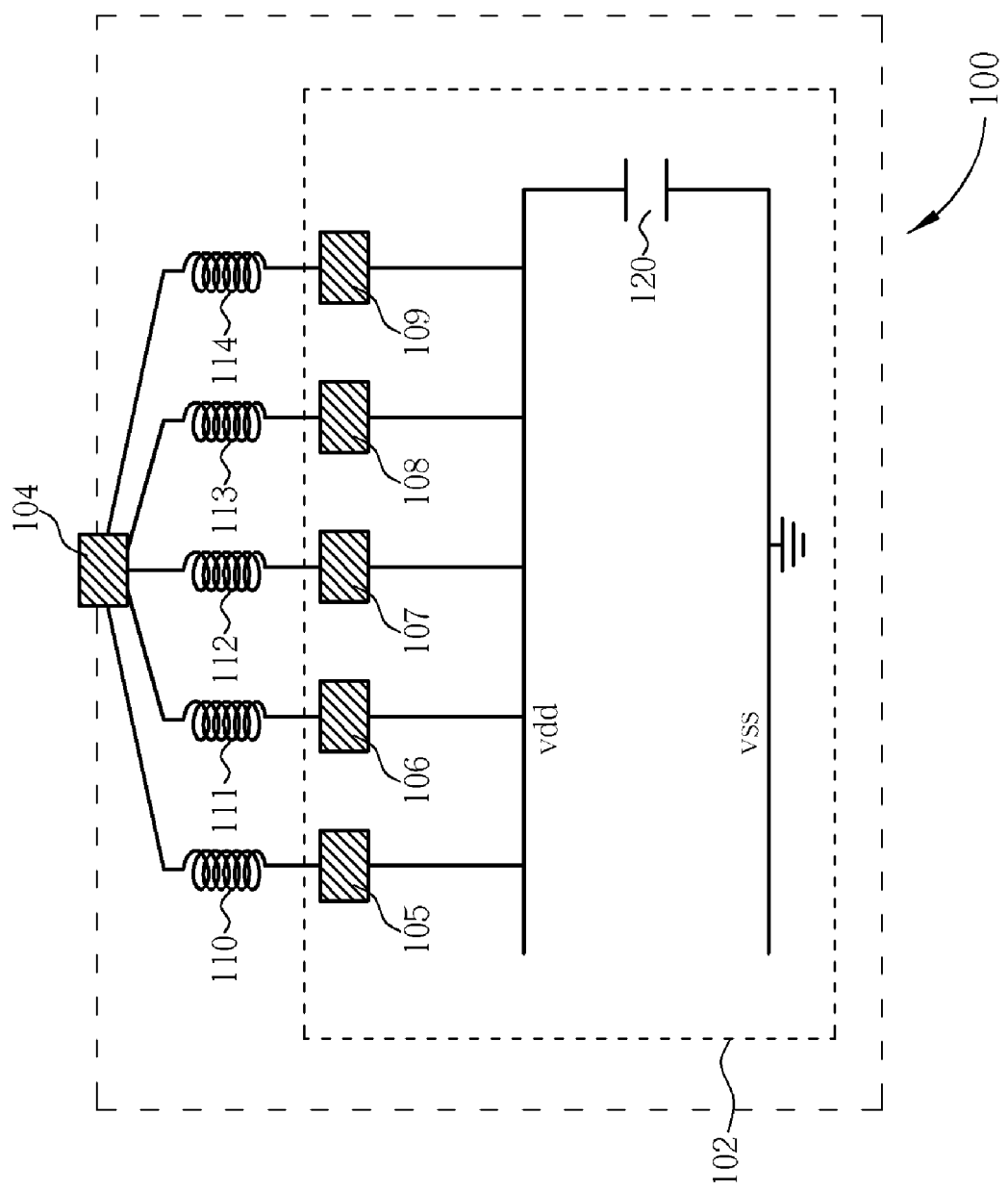
FIG. 1 shows a simplified block diagram of a five-fold bonding wire scheme according to conventional method.
Figure 2:
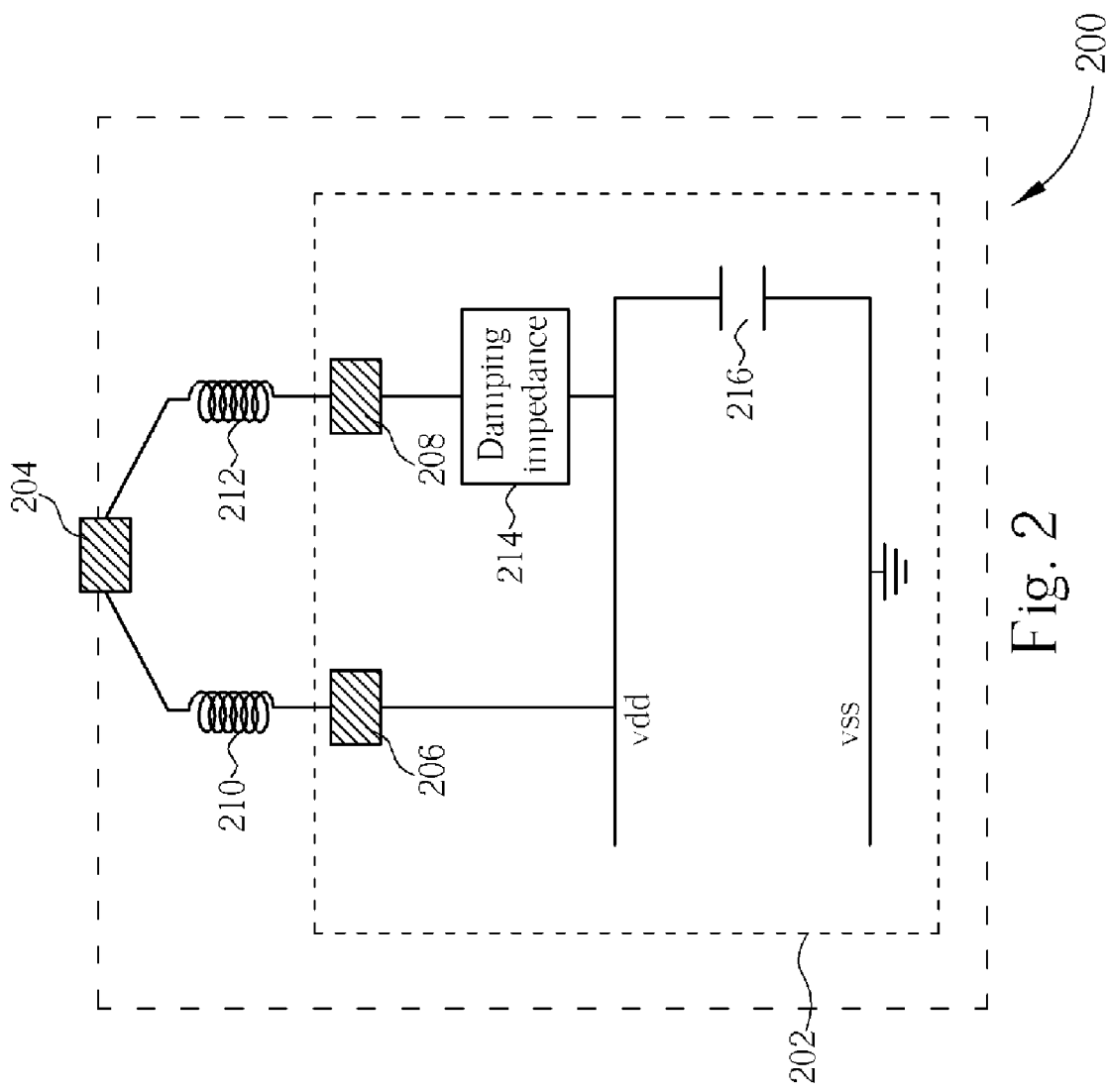
FIG. 2 shows a simplified block diagram of a voltage jitter suppression circuit according to an embodiment of the present invention.

FIG. 2 shows a simplified block diagram of a voltage jitter suppression circuit according to an embodiment of the present invention. As shown in FIG. 2, the voltage jitter suppression circuit 200 includes a pin 204, a first bonding pad 206, a second bonding pad 208, a first bonding wire 210, a second bonding wire 212, a damping impedance 214, and a capacitor 216. The first bonding wire 210 and the second bonding wire 212 have a first inductance value and a second inductance value, respectively, and are equivalent to a parasitic inductance of the pin 204 and the first bonding pad 206 and a parasitic inductance of the pin 204 and the second bonding pad 208, respectively. The first bonding wire 210 is coupled between the pin 204 and the first bonding pad 206, and the second bonding wire 212 is coupled between the pin 204 and the second bonding pad 208. The first bonding pad 206 is coupled to a power line inside the chip 202, wherein the power line can be a high voltage level power line (such as Vdd) or a low voltage level power line (such as Vss, GND) inside the chip 202. The damping impedance 214 is coupled between the power line inside the IC and the second bonding pad 208, and the capacitor 216 is utilized to be equivalent to a capacitance between the high voltage level power line and the low voltage level power line. In another embodiment, the first bonding pad 206 and the first bonding wire 210 can be omitted.

In another embodiment, an impedance value of the damping impedance 214 is adjustable. The impedance value of the damping impedance 214 be adjusted to attain the requirement of alleviating the voltage jitter between the two terminals of the equivalent circuit.

Figure 3:
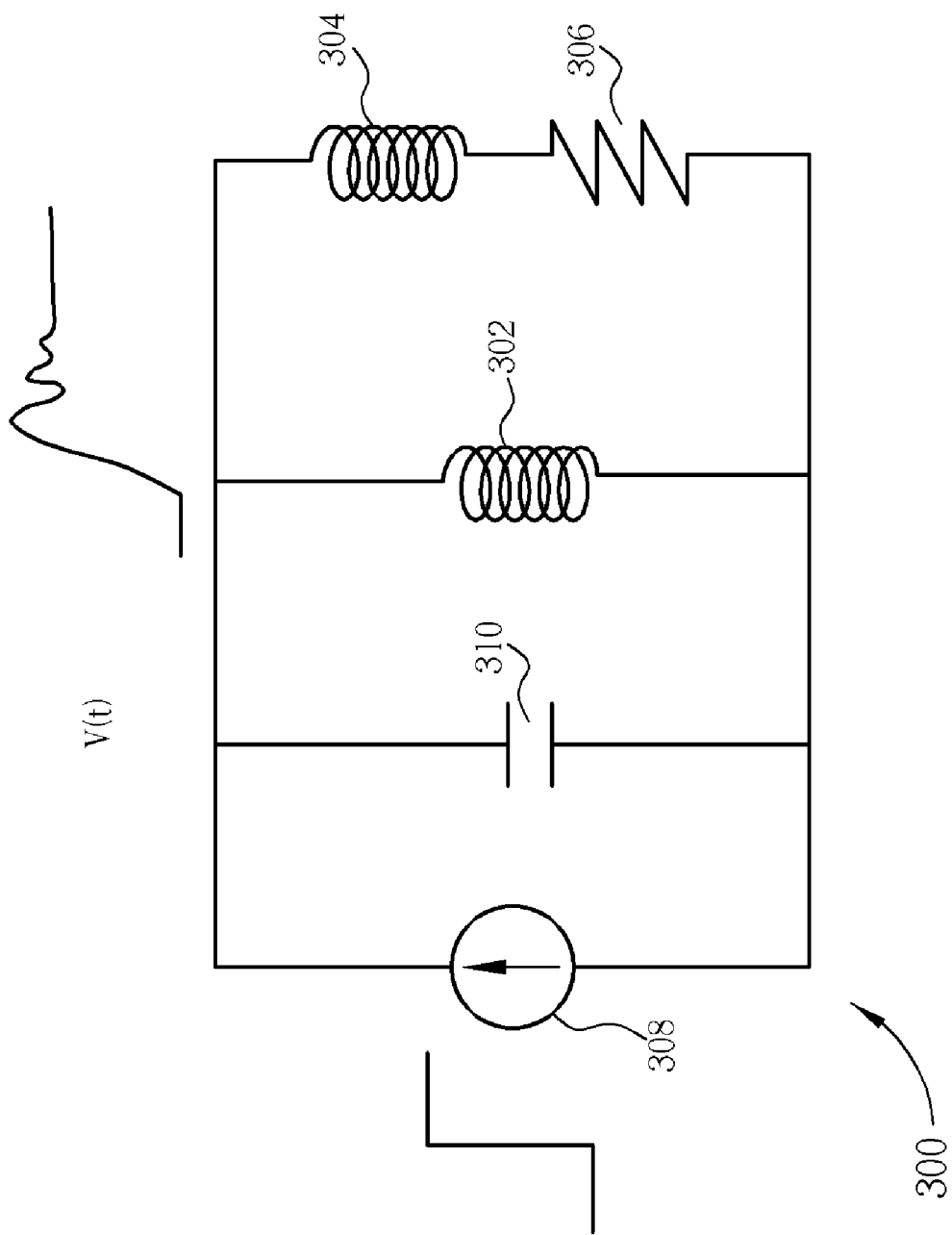
FIG. 3 is an equivalent circuit diagram of FIG. 2.

FIG. 3 shows an equivalent circuit diagram 300 of FIG. 2. in the equivalent circuit diagram 300, a second inductance 304 represents the second bonding wire 212, a impedance 306 represents the damping impedance 214, and a first inductance 302 representing the first bonding wire 210, and a capacitor 310 represents the capacitor 216. In this equivalent circuit 300, a signal source provide a unit step function signal which is presumed to be input to simulate ea practical circuit. Here, the present invention utilizes a Laplace transformation to calculate V(s)=I(s)Z(s), and two characteristic formulas of the equivalent circuit diagram 300 can be obtained as follows:

$$Z(s) = \frac{sL_2L_1 + sL_1R_s}{s^3L_2L_1C_1 + s^2L_1C_1R_s + s(L_2+L_1) + R_s}$$

$$V(s) = \frac{Z(s)}{s} = \frac{L_2L_1 + L_1R_s}{s^3L_2L_1C_1 + s^2L_1C_1R_s + s(L_2+L_1) + R_s}$$

Figure 4:
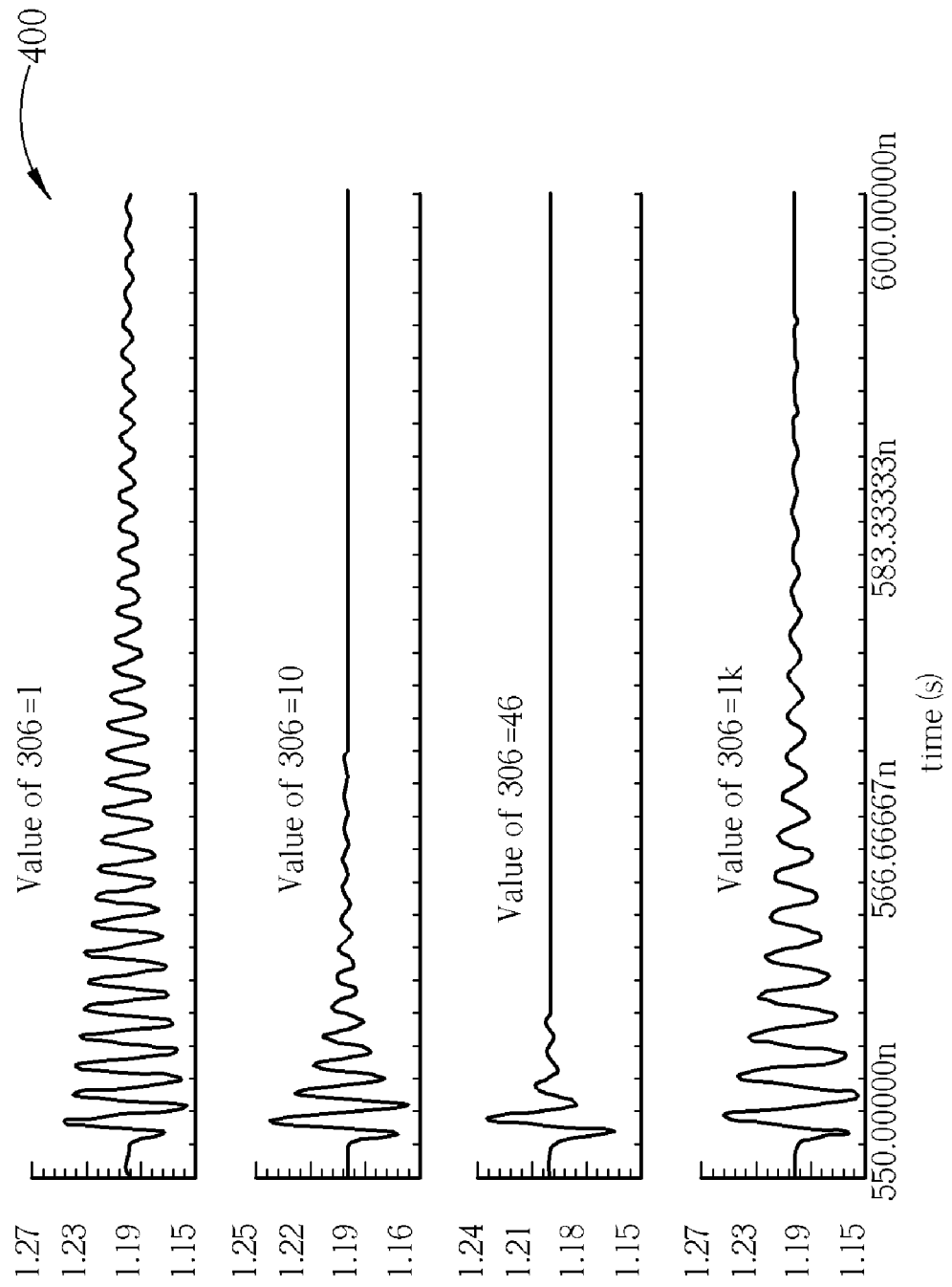
FIG. 4 shows a V(t) simulation result of the equivalent circuit diagram of FIG. 2.

A V(t) simulation result of the equivalent circuit diagram 300 of FIG. 2 can be obtained according to the above characteristic formulas, and the simulation result is shown in FIG. 4. It is known that when an impedance value of the damping impedance 306 is too large (such as 1000 ohms) or too small (such as 1 ohm), the V(t) has a more serious noise jitter. As long as the impedance value of the damping impedance 306 is close to a specific value (such as 46 ohms), the jitter will be smaller and disappear faster. Of course, the impedance value of the damping impedance 306 can be adjusted to reduce and stabilize the jitter of the V(t) more quickly. In other words, the impedance value of the damping impedance 306 is determined according to the values of the internal elements of the equivalent circuit diagram 300.

Figure 7A:
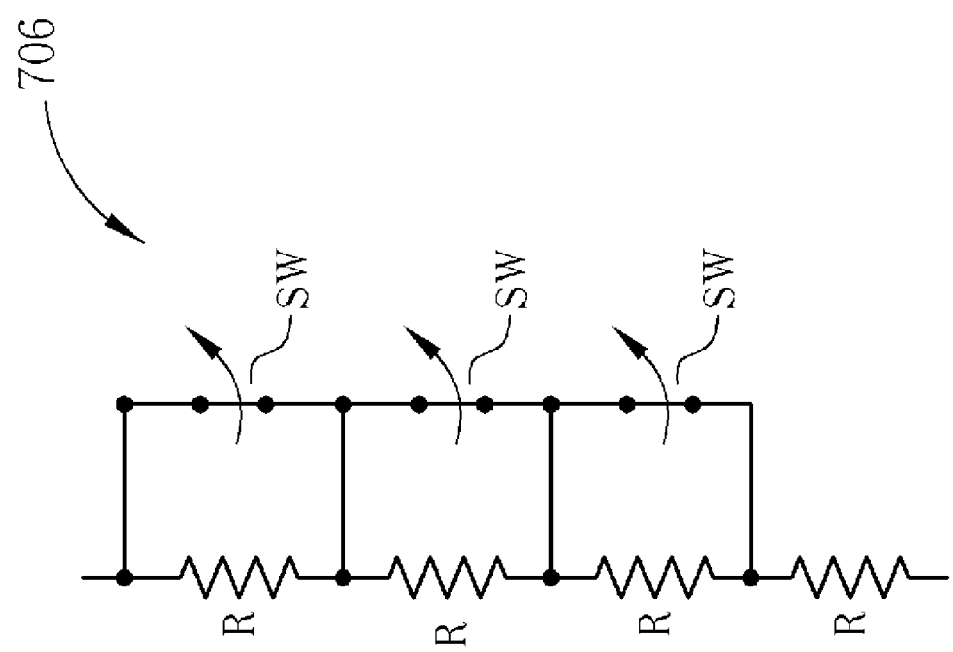
FIG. 7A and 7B are simplified block diagrams of the damping impedance shown in FIG. 3.
Figure 7B:
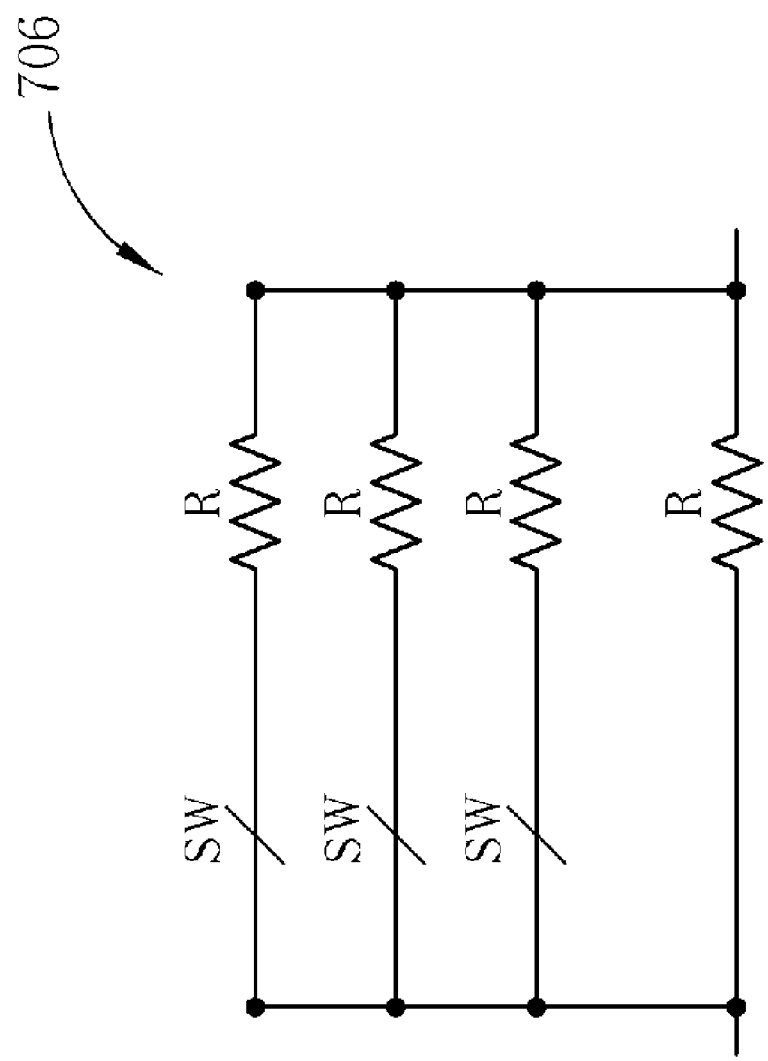

In an embodiment, the damping impedance 306 is a resistance element, and in a preferred embodiment, the damping impedance 306 is an adjustable resistance circuit. The adjustable resistance circuit receives a control signal (which is transmitted from a control circuit of FIG. 5, for example), and the adjustable resistance circuit provides a corresponding resistance value according to the control signal. In a preferred embodiment, the control signal is transmitted from at least a control register, and the value of the control signal stored in the control register can be set directly or indirectly by a software or a firmware or after automatic detection. In another embodiment, the adjustable resistance circuit (i.e. the damping impedance 306) is a resistance network circuit 706 including a plurality of resistance elements R and a plurality of corresponding switch elements SW as shown in FIG. 7A or FIG. 7B, wherein the resistance value is adjusted by controlling whether the corresponding switch elements SW are ON or OFF to change the connection scheme (which can be a series connection scheme or a parallel connection scheme) of the plurality of resistance elements R. For example, the number of the series connection or the parallel connection can be changed. In addition, the switch elements SW are controlled by the control signals.

Figure 5:
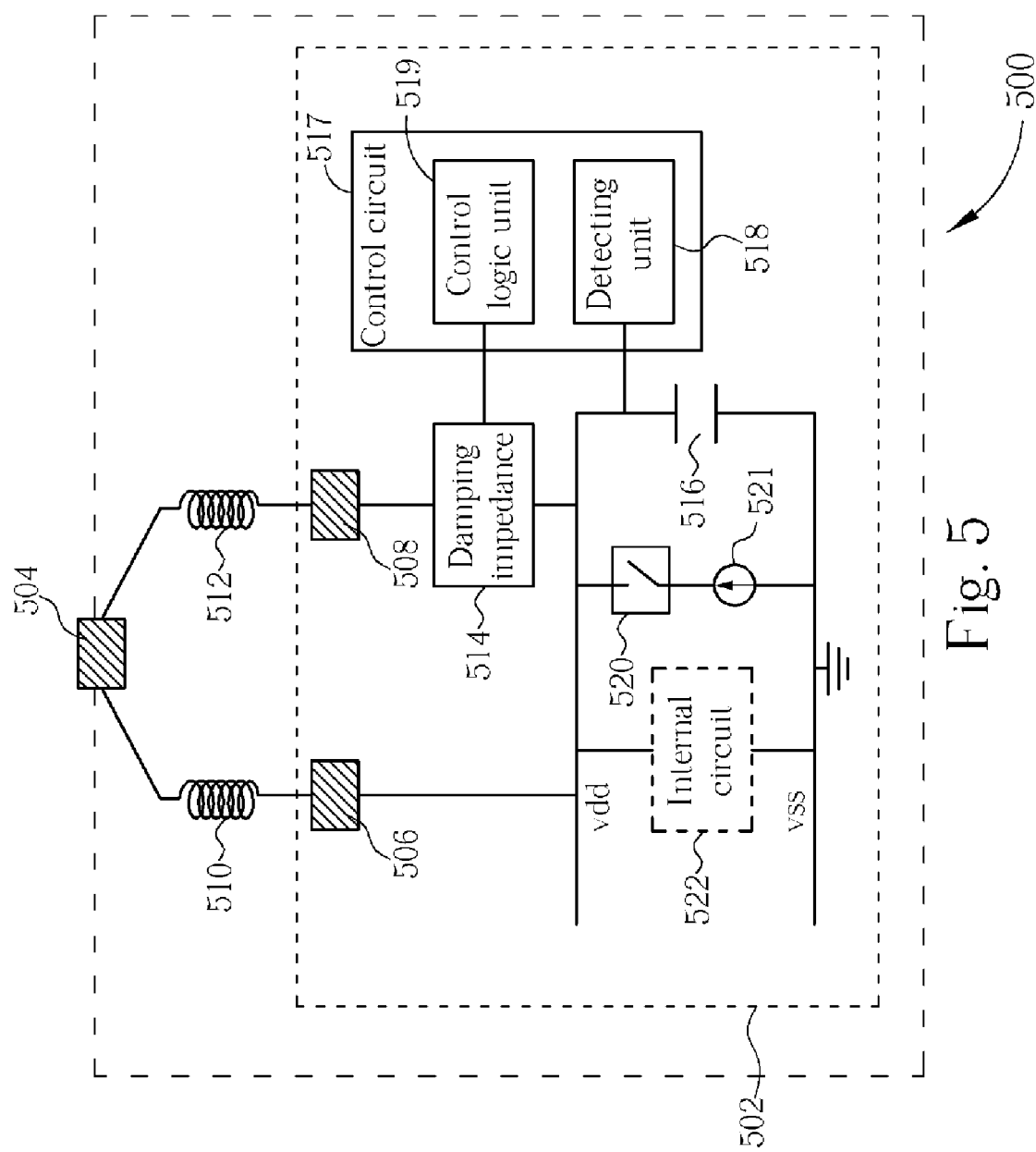
FIG. 5 shows a simplified block diagram of a voltage jitter suppression circuit according to another embodiment of the present invention.

The inductance values of the first bonding wire 210 and the second bonding wire 212 in FIG. 2 can only be estimated in advance, and these actual inductance values of the first bonding wire 210 and the second bonding wire 212 cannot be controlled precisely. Please refer to FIG. 5. FIG. 5 shows a simplified block diagram of a voltage jitter suppression circuit according to another embodiment of the present invention. In comparison with FIG. 2, there is an additional control circuit 517 in FIG. 5. The control circuit 517 is utilized for receiving the voltage signal, and for monitoring or detecting a voltage variation of the voltage signal, so the control circuit 517 can output a proper control signal according to the voltage variation of the voltage signal to adjust the resistance value of the adjustable resistance circuit 514 so as to attain better efficiency in suppressing the voltage jitter.

Figure 8:
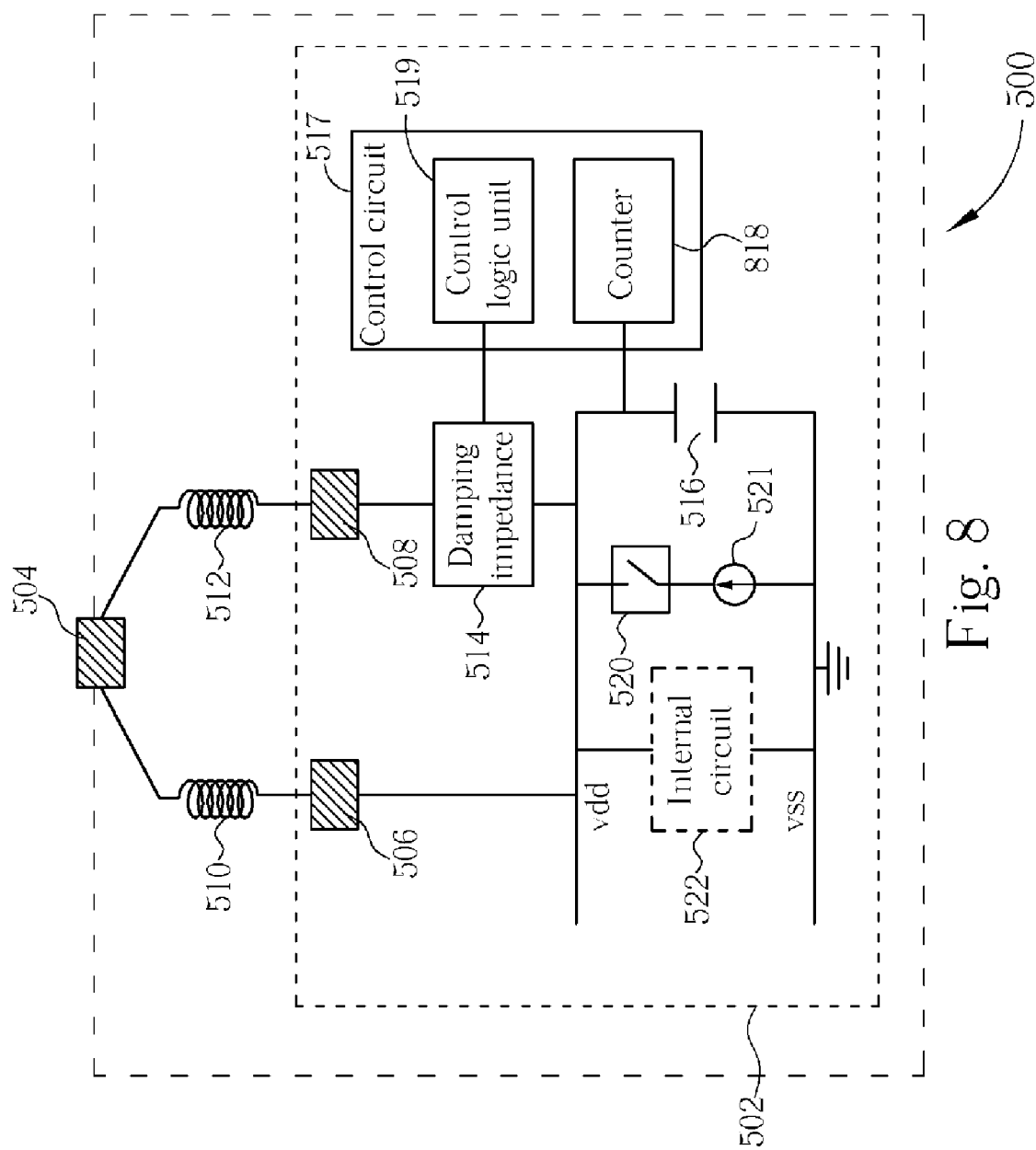
FIG. 8 shows a simplified block diagram of a voltage jitter suppression circuit according to a first exemplary variation of the embodiment shown in FIG. 5.
Figure 9:
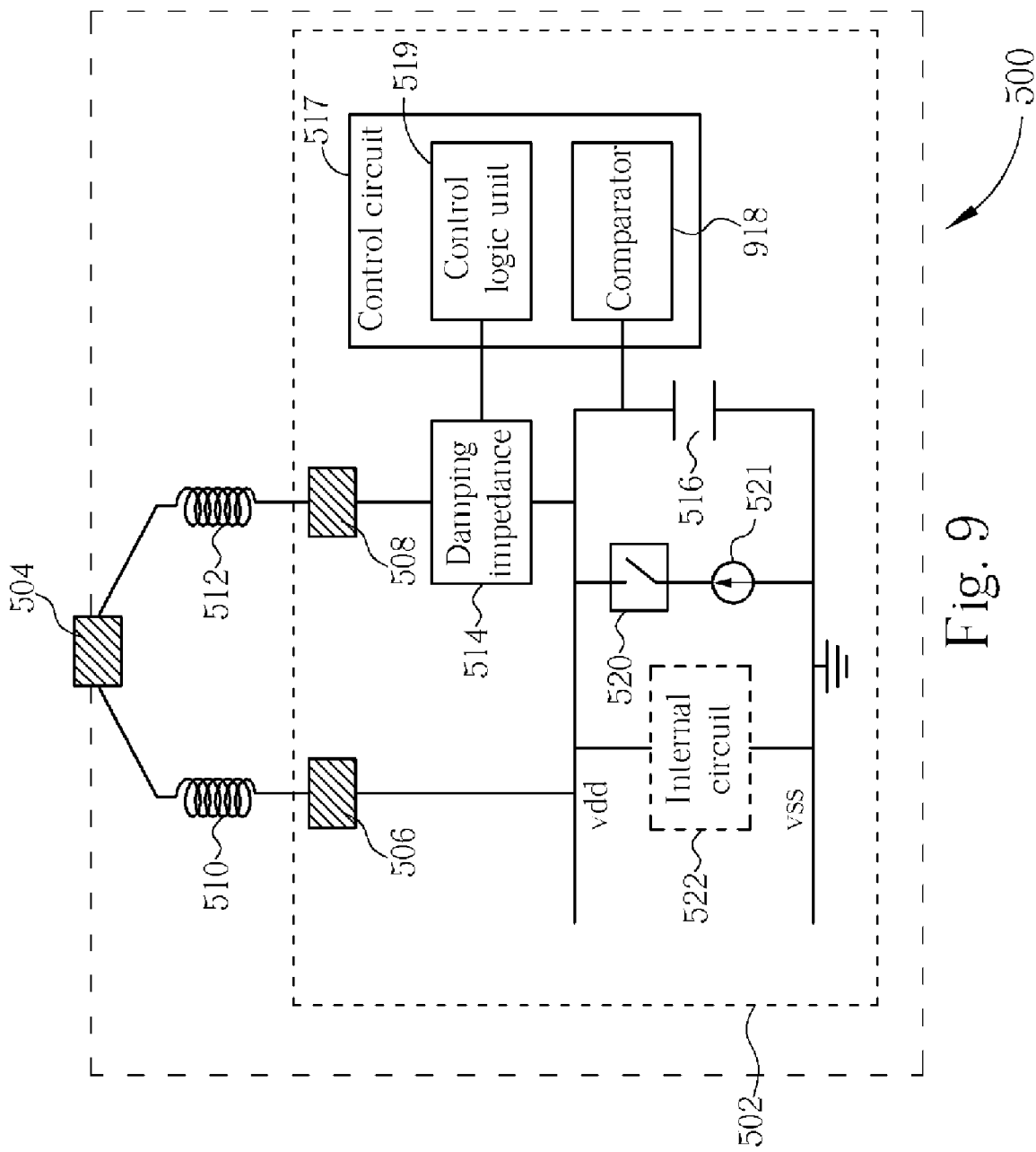
FIG. 9 shows a simplified block diagram of a voltage jitter suppression circuit according to a second exemplary variation of the embodiment shown in FIG. 5.
Figure 10:
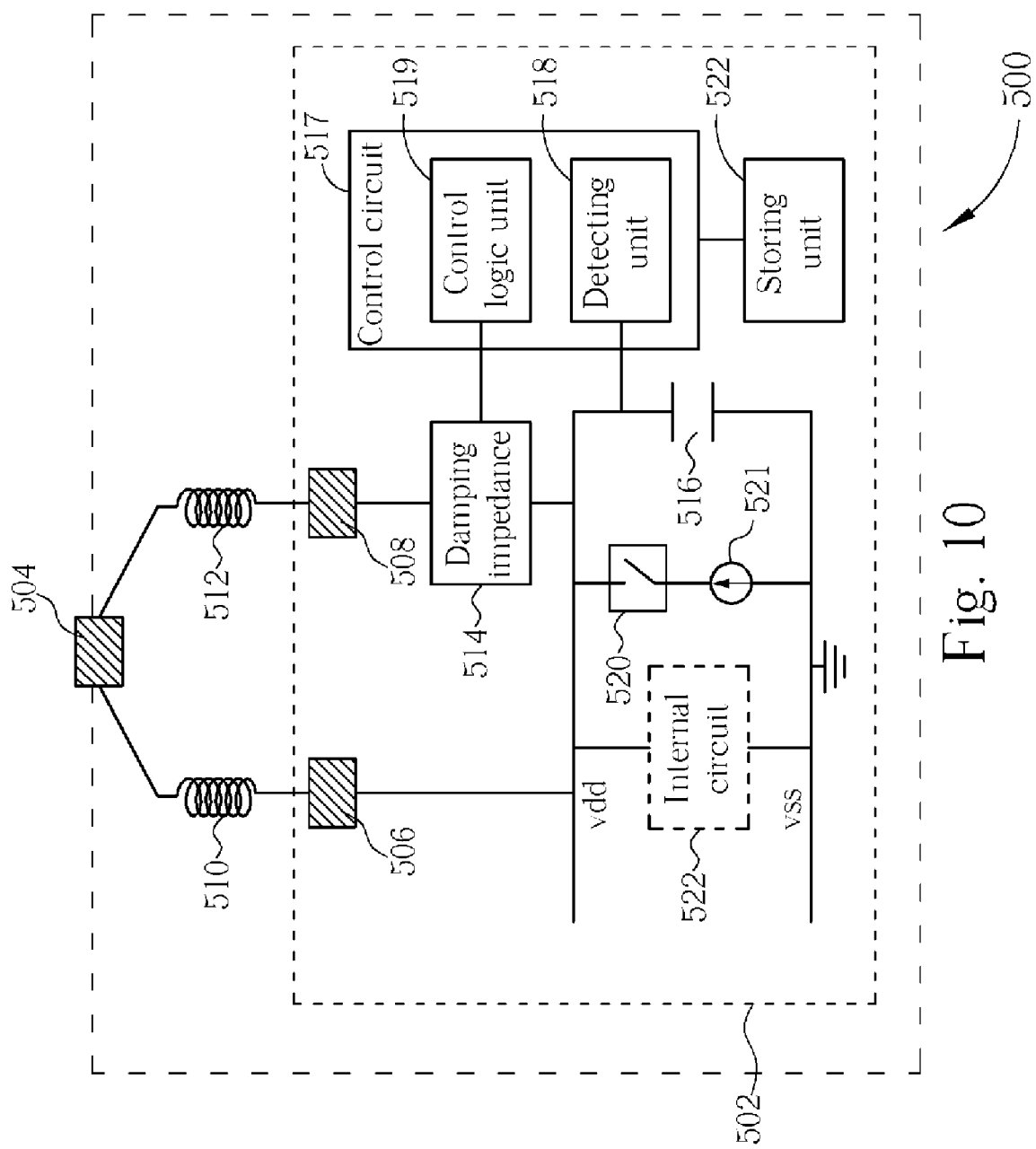
FIG. 10 shows a simplified block diagram of a voltage jitter suppression circuit according to a third exemplary variation of the embodiment shown in FIG. 5.

The control circuit 517 has many embodiments. For example, the control circuit 517 includes a detecting unit 518 and a control logic unit 519, wherein the detecting unit 518 can be a counter 818 as shown in FIG. 8. The control logic unit 519 sets an impedance value of the damping impedance 514 in advance, and then generates voltage jitter; for example, utilizes at least a control switch element 520 and a current source 521 to transiently change a current to induce the voltage jitter. In the meantime, the counter 818 is utilized for counting a jitter number of the voltage signal in a predetermined time to generate a counting value and providing the counting value to the control logic unit 519. A plurality of counting values corresponding to the different impedance values of the damping impedance 514 can be obtained by utilizing the control logic unit 519 to perform the above steps repeatedly, so a better impedance value of the damping impedance 514 can be determined from the plurality of counting values (i.e. a smallest counting value is determined from the plurality of counting values, and a corresponding impedance value is found according to the smallest counting value), and a proper control signal is output. In another embodiment, the detecting unit 518 can be an analog-to-digital converter (ADC). In this embodiment, the ADC outputs digital signals representing the voltage variation of the voltage signal. The control logic unit 519 receives and records the digital signals representing the voltage variation of the voltage signal, and determines a digital signal representing the smallest voltage variation (for example, by accumulating a value difference of two adjacent digital signals, and if the accumulation value is the smallest, this means that the jitter is the smallest) so as to determine a better impedance value. In another embodiment, the detecting unit 518 can be a comparator 918 for receiving the voltage signal and a reference voltage as shown in Fig. 9. When the voltage variation of the voltage signal is larger, the number of output value variation occurrences (i.e. the number of transitions between the "high level" and the "low level") from the comparator 918 will be higher. When the voltage variation of the voltage signal is smaller, the number of comparator output variations will be fewer, and thus the control logic unit 519 can determine a better impedance value according to the number of times of the transition. The control circuit 517 can operate in a normal operation mode (with fixed intervals or arbitrary intervals), a calibration mode, or a power-up mode (during an initial state of turning on an internal circuit 522 of the circuit). In an embodiment, the control signal generated by the control circuit 517 is stored in a storing unit 522 as shown in FIG. 10 in the calibration mode; the storing unit 522 is utilized for outputting the control signal and the control circuit 517 is disabled in the normal operation mode. The storing unit 522 can be any element with a storing function such as a register, all kinds of memories, a buffer, etc.

Figure 6:
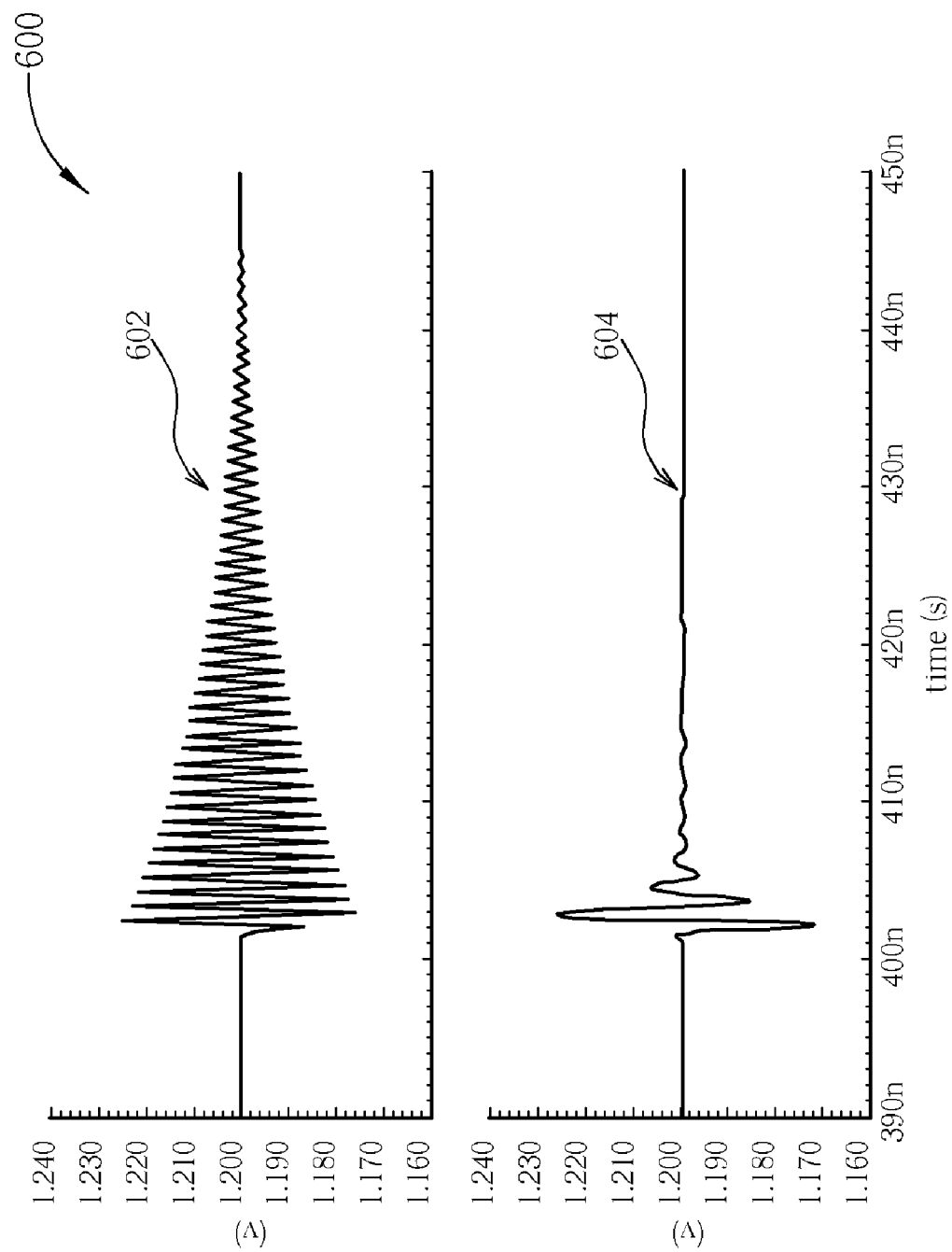
FIG. 6 shows a result obtained by a computer simulation according to an embodiment of the present invention and a conventional five-fold bonding wire scheme.

FIG. 6 shows two results obtained by a computer simulation according to an embodiment of the present invention and a conventional five-fold bonding wire scheme. As shown in FIG. 6, it is obvious that the embodiment of the present invention has a significant effect in comparison with conventional multiple bonding wire methods.

The present invention is not only able to restrain the voltage jitter phenomenon efficiently and improve circuit performance, but also indirectly to reduce the chip cost since the number of I/O pins outside the chip is effectively decreased. Since the voltage jitter phenomenon is efficiently suppressed, for the internal circuit of the chip, the probability of an operation error due to noise interference will be reduced. The present invention is especially suitable for application in a circuit with a low voltage source, or a digital circuit, or a digital circuit of a low voltage source, because circuits with low voltage sources and digital circuits tend to be particularly susceptible to voltage jitter.

Regardless of the circuit frequency and voltage, the voltage jitter phenomenon of the circuit can be improved significantly by utilizing the present invention.

Those skilled in the art will readily observe that numerous modifications and alterations of the device and method may be made while retaining the teachings of the invention.

What is claimed is:

1. An apparatus of an integrated circuit (IC) for alleviating a voltage jitter of a power line of the IC, comprising:
    a pin;
    a first bonding pad;
    a first bonding wire, coupled between the pin and the first bonding pad, having a first inductance;
    a damping impedance coupled between the power line and the first bonding pad; and
    a control circuit, coupled to the damping impedance and the power line, for monitoring a voltage variation of the power line to output a control signal to the damping impedance to thereby control an impedance value of the damping impedance, the control circuit comprising:
        a detecting circuit, for monitoring the voltage variation of the power line to output a detecting result; and
        a control logic unit, coupled to the detecting circuit, for determining the control signal according to the detecting result.

2. The apparatus of claim 1, wherein an impedance value of the damping impedance is adjusted according to a control signal.

3. The apparatus of claim 2, further comprising:
    a storing unit, for storing the control signal.

4. The apparatus of claim 1, wherein the control circuit is disabled after the control signal is stored in a storing unit.

5. The apparatus of claim 1, wherein the detecting circuit further comprises a counter for counting the voltage jitter of the power line to output the detecting result.

6. The apparatus of claim 1, wherein the detecting circuit further comprises a comparator for comparing a voltage signal of the power line with a reference voltage to output the detecting result.

7. The apparatus of claim 1, wherein the IC further comprises an internal circuit, and the control circuit operates during an initial state of turning on the internal circuit.

8. The apparatus of claim 1, wherein the control circuit changes the impedance value of the damping impedance successively so as to generate a plurality of detecting results, and the control logic unit determines the impedance value of the damping impedance according to the plurality of detecting results.

9. The apparatus of claim 1, wherein the apparatus comprises a source and a control switch element, and the control switch element is controlled so that the source actively induces the voltage jitter of the power line in a calibration mode.

10. The apparatus of claim 1, wherein the apparatus comprises a current source which induces the voltage jitter of the power line by a transiently changing current of the current source.

11. The apparatus of claim 1, wherein the damping impedance further comprises a plurality of resistance elements and a plurality of switch elements, and a control signal is utilized to control the plurality of switch elements so as to adjust an impedance value of the damping impedance.

12. The apparatus of claim 1, further comprising:
    a second bonding pad coupled to the power line; and
    a second bonding wire coupled between the pin and the second bonding pad.

13. The apparatus of claim 1, wherein an impedance of the damping impedance depends on the first inductance.

14. A method for alleviating a voltage jitter of a power line of an integrated circuit (IC), comprising:
    providing a pin and a first bonding pad;
    providing a first bonding wire coupled between the pin and the first bonding pad,
    wherein the first bonding wire has a first inductance;
    providing a damping impedance coupled between the power line of the IC and the first bonding pad;
    monitoring the voltage variation of the power line to output a detecting result; and
    outputting a control signal according to the detecting result to thereby control an impedance value of the damping impedance, wherein monitoring the voltage variation of the power line to output a detecting result and outputting the control signal according to the detecting result further comprises:
        counting the voltage utter of the power line at different times to generate a plurality of counting results; and
        outputting the control signal according to the plurality of counting result.

15. The method of claim 14, wherein an impedance value of the damping impedance is adjusted according to the control signal.

16. The method of claim 14, the steps of monitoring the voltage variation of the power line to output a detecting result and outputting the control signal according to the detecting result further comprising:
    comparing the voltage of the power line with a reference voltage at different times to output a plurality of comparing results; and
    outputting the control signal according to the plurality of comparing results.

17. The method of claim 14, wherein before the monitoring step, the method further comprises:
    inducing the voltage jitter of the power line in a calibration mode.

18. The method of claim 14, wherein the step of monitoring is disabled after the control signal is stored.

19. The method of claim 14, further comprising:
    providing a second bonding pad; and
    providing a second bonding wire coupled between the pin and the second bonding pad.

20. The method of claim 14, wherein an impedance of the damping impedance depends on the first inductance.

* * * * *